(12) United States Patent
Ishizuka

(10) Patent No.: US 9,142,449 B2
(45) Date of Patent: Sep. 22, 2015

(54) METHOD FOR MANUFACTURING BONDED WAFER

(71) Applicant: SHIN-ETSU HANDOTAI CO., LTD., Tokyo (JP)

(72) Inventor: Tohru Ishizuka, Takasaki (JP)

(73) Assignee: SHIN-ETSU HANDOTAI CO., LTD., Tokyo (JP)

(*) Notice: Subject to any disclaimer, the term of this patent is extended or adjusted under 35 U.S.C. 154(b) by 0 days.

(21) Appl. No.: 14/391,086

(22) PCT Filed: Apr. 2, 2013

(86) PCT No.: PCT/JP2013/002278
§ 371 (c)(1),
(2) Date: Oct. 7, 2014

(87) PCT Pub. No.: WO2013/161188
PCT Pub. Date: Oct. 31, 2013

(65) Prior Publication Data
US 2015/0118825 A1 Apr. 30, 2015

(30) Foreign Application Priority Data

Apr. 26, 2012 (JP) .................................. 2012-101768

(51) Int. Cl.
| | |
|---|---|
| *H01L 21/30* | (2006.01) |
| *H01L 21/46* | (2006.01) |
| *H01L 21/762* | (2006.01) |
| *H01J 37/32* | (2006.01) |

(Continued)

(52) U.S. Cl.
CPC ..... *H01L 21/76254* (2013.01); *H01J 37/32412* (2013.01); *H01L 21/02043* (2013.01); *H01L 21/6875* (2013.01); *H01L 21/306* (2013.01)

(58) Field of Classification Search
CPC ............... H01L 21/02038; H01L 21/02043; H01L 21/02107; H01L 21/022; H01L 21/2007; H01L 21/76254; H01L 21/76259; H01L 21/76251; H01L 21/68714
See application file for complete search history.

(56) References Cited

U.S. PATENT DOCUMENTS

| | | | | |
|---|---|---|---|---|
| 6,335,535 | B1 * | 1/2002 | Miyake et al. | ........... 250/492.21 |
| 6,534,380 | B1 * | 3/2003 | Yamauchi et al. | ............. 438/455 |

(Continued)

FOREIGN PATENT DOCUMENTS

| | | |
|---|---|---|
| JP | A-56-135934 | 10/1981 |
| JP | A-5-82404 | 4/1993 |

(Continued)

OTHER PUBLICATIONS

Nov. 6, 2014 International Preliminary Report on Patentability issued in International Application No. PCT/JP2013/002278.

(Continued)

*Primary Examiner* — Thanh Y Tran
(74) *Attorney, Agent, or Firm* — Oliff PLC

(57) ABSTRACT

The present invention is a method for manufacturing a bonded wafer, including performing a plasma activation treatment on at least one of the bonded surfaces of the bond wafer and the base wafer before bonding, wherein the plasma activation treatment is performed while a back surface of at least one of the bond wafer and the base wafer is placed on a stage with the back surface being in point contact or line contact with the stage. The method can inhibit increase in attached substances such as particles on the back surface of a wafer during the plasma activation treatment, and prevent re-attachment of the attached substances to the bonded surface of the wafer, particularly when the wafer after the plasma activation treatment is cleaned with a batch cleaning apparatus.

3 Claims, 3 Drawing Sheets

(51) Int. Cl.
*H01L 21/687* (2006.01)
*H01L 21/02* (2006.01)
*H01L 21/306* (2006.01)

(56) References Cited

U.S. PATENT DOCUMENTS

| | | | | |
|---|---|---|---|---|
| 8,557,679 | B2* | 10/2013 | Chuang et al. | 438/458 |
| 2002/0134511 | A1 | 9/2002 | Ushioda et al. | |
| 2004/0063298 | A1* | 4/2004 | Aga et al. | 438/406 |
| 2008/0227271 | A1 | 9/2008 | Morimoto et al. | |
| 2008/0299742 | A1* | 12/2008 | Akiyama et al. | 438/458 |
| 2010/0025804 | A1 | 2/2010 | Kawai et al. | |

FOREIGN PATENT DOCUMENTS

| | | |
|---|---|---|
| JP | A-2002-313898 | 10/2002 |
| JP | A-2006-339363 | 12/2006 |
| JP | A-2007-173354 | 7/2007 |
| JP | A-2008-227207 | 9/2008 |
| JP | A-2009-212402 | 9/2009 |
| JP | A-2012-38963 | 2/2012 |

OTHER PUBLICATIONS

International Search Report issued in International Application No. PCT/JP2013/002278 mailed May 14, 2013.

* cited by examiner 6b, 7b

104

106

METHOD FOR MANUFACTURING BONDED WAFER

TECHNICAL FIELD

The present invention relates to a method for manufacturing a bonded wafer by the ion implantation delamination method.

BACKGROUND ART

The method for manufacturing SOI wafers in which ions-implanted wafers are separated after bonding, i.e., the ion implantation delamination method (an art also referred to as the Smart Cut method (registered trademark)), has attracted attention as a method for manufacturing bonded wafers, particularly a method for manufacturing thin SOI wafers that enables the performance improvements of advanced integrated circuits.

The ion implantation delamination method is an art (See Patent Document 1) to form an SOI wafer in the following manner: An oxide film is formed on at least one of two silicon wafers, and gas ions, such as hydrogen ions or rare gas ions, are implanted from a front surface of one of the silicon wafers (a bond wafer) to form a micro bubble layer (an enclosed layer) in the interior of the wafer. The surface from which the ions are implanted is then brought into close contact with and bonded to the other silicon wafer (a base wafer) through the oxide film, and a heat treatment (a delamination heat treatment) is then performed to cleave one of the wafers (the bond wafer) along the micro bubble layer so that the bond wafer is delaminated into a thin film. A heat treatment (a bonding heat treatment) is then performed to strengthen a bond between the wafers. At this point, the cleave surface (the separation surface) is a surface of an SOI layer and an SOI wafer having a thin SOI film with high uniformity is relatively readily obtained. In the method, the bond wafer and the base wafer may be bonded directly without the oxide film.

In the ion implantation delamination method, the bonding heat treatment is generally performed after separation. It is known that increasing the bonding strength before occurrence of separation with the wafers being in close contact exerts a positive effect on quality, so some methods for increasing the bonding strength have been considered. One of the methods is to plasma-activate a bonded surface before bonding. Examples of the procedure for performing a plasma activation treatment include an open-type atmospheric pressure plasma method in which a wafer disposed on a stage is scanned in its plane with a plasma generating electrode under the atmosphere, and a reduced pressure plasma method in which a wafer is disposed on a stage in a chamber, and plasma is generated with a plate-shaped plasma generating electrodes that are oppositely disposed while the pressure in the chamber is reduced to control the pressure of nitrogen or oxygen (See Patent Documents 2 to 4, for example).

Performing a plasma activation treatment removes surface impurities, such as organic substances, attached to the wafer surface, thereby exposing a clean surface. In addition, it is understood that since a hydroxyl group is easy to bond to an Si dangling bond on the exposed clean surface, the wafer bonding strength in the state where the wafers are in close contact is increased. It is generally known that in plasma activation for bonding, the intensity of plasma needs to be low to the extent that the substances attached to the surface are removed because if the intensity of plasma is too high, damage to the surface occurs, thereby rather decreasing the bonding strength.

CITATION LIST

Patent Literature

Patent Document 1: Japanese Unexamined Patent publication (Kokai) No. H05-82404
Patent Document 2: Japanese Unexamined Patent publication (Kokai) No. 2006-339363
Patent Document 3: Japanese Unexamined Patent publication (Kokai) No. 2009-212402
Patent Document 4: Japanese Unexamined Patent publication (Kokai) No. 2012-38963

SUMMARY OF INVENTION

Technical Problem

It is conventionally understood that when plasma activation is performed before wafer bonding, a wafer is supposed to act as a counter electrode to a plasma generating electrode, and the wafer needs to be in sufficient contact with a stage on which the wafer is disposed. Accordingly, the stage is generally configured such that the contact area with the back surface of the wafer is larger. FIG. 5 schematically illustrates a stage of a plasma activation apparatus that has been commonly used. As illustrated in FIG. 5, in the stage 104, grooves 106 for air bleeding are formed on the surface with which the back surface of a wafer will be brought into contact, and regions other than the grooves 106 are flat. The contact area is large because the flat regions will be brought into contact with a wafer.

Such a plasma activation treatment enables the bonded surface of a wafer to be cleaned. The investigation conducted by the present inventor, however, revealed that substances, such as particles, that are attached to the back surface of the wafer after the plasma activation treatment rather increase due to contact with the stage.

To prevent bonding failures caused by attached substances such as particles that are put between the bonded surfaces when wafers are bonded, the wafers may be simultaneously cleaned, for example, with a batch type of wafer cleaning apparatus before the wafers are bonded. In this cleaning, when the wafers are dipped in a cleaning tank, substances such as particles attached to the back surface of the wafers during the plasma activation treatment, as described above, are released to the interior of the cleaning tank and the substances released from one of the wafers are re-attached to the front surface of the other wafer, for example, disposed so as to face the back surface of one of the wafers. Even when the degree of cleanness on the front surface side of the wafer is increased by the plasma activation treatment, there thus arises the problem in that the attached substances such as particles on the front surface side of the wafer are rather increased during a subsequent cleaning process and the like and the increased attached substances exert an adverse effect on the degree of cleanness of the wafer bonded surface so that surface defects, for example, are generated on a bonded wafer.

The present invention was accomplished in view of the above-described problems. It is an object of the present invention to provide a method for manufacturing a bonded wafer that can inhibit increase in attached substances such as particles on the back surface of a wafer during a plasma activation treatment, and prevent re-attachment of the attached substances to the bonded surface of the wafer, particularly when the wafer is cleaned with a batch cleaning apparatus after the plasma activation treatment.

Solution to Problem

To achieve this object, the present invention provides a method for manufacturing a bonded wafer, comprising: implanting at least one gas ion selected from a hydrogen ion and a rare gas ion into a bond wafer from a surface of the bond wafer to form a layer of the implanted ion; bonding the surface from which the ion is implanted into the bond wafer and a surface of a base wafer directly or through an oxide film; and separating the bond wafer along the layer of the implanted ion to form a bonded wafer having a thin film on the base wafer; the method further comprising performing a plasma activation treatment on at least one of the bonded surfaces of the bond wafer and the base wafer before bonding, wherein the plasma activation treatment is performed while a back surface of at least one of the bond wafer and the base wafer is placed on a stage with the back surface being in point contact or line contact with the stage.

Such a manufacturing method enables reduction in the contact area between the wafer back surface and the stage when the plasma activation treatment is performed, thereby greatly inhibiting increase in substances, such as particles, attached to the wafer back surface. The chances of re-attachment of particles from the back surface to the bonded surface cleaned by the plasma activation can be reduced, even when the wafer is cleaned with a batch cleaning apparatus after the plasma activation treatment. As a result, a bonded wafer can be manufactured with increased bonding strength by the plasma activation and inhibited surface defects due to attached substances put between the wafers at the bonding interface.

In the plasma activation treatment, at least one of the bond wafer and the base wafer may be placed on a point-like or line-like protrusion formed on a surface of the stage or on a base having a point-like or line-like support, the base being disposed on a surface of the stage, whereby the back surface is in point contact or line contact with the stage.

In this manner, the back surface of the wafer to be treated can readily be placed on the stage with the back surface being in point contact or line contact with the stage.

Moreover, the bond wafer or the base wafer subjected to the plasma activation treatment is preferably cleaned with a batch cleaning apparatus before bonding.

Since the inventive method for manufacturing a bonded wafer can greatly inhibit increase in substances attached to the wafer back surface during the plasma activation treatment as above, the method is very effective to avoid the problem of re-attachment of attached substances to the bonded surface, which may occur when the wafer after the plasma activation treatment is cleaned with a batch cleaning apparatus.

Advantageous Effects of Invention

According to the inventive method for manufacturing a bonded wafer, in the process of a plasma activation treatment, the plasma activation treatment is performed while the back surface of at least one of a bond wafer and a base wafer, which are processing objects, is placed on a stage with the back surface being in point contact or line contact with the stage. The contact area between the wafer back surface and the stage can thereby be reduced and increase in attached substances, such as particles, on the back surface side is extremely limited. The chances of re-attachment of the attached substances from the back surface to the front surface of a wafer cleaned by the plasma activation can consequently be reduced, even when pre-bond cleaning of the wafer is performed with a batch cleaning apparatus after the plasma activation treatment. As a result, it is possible to inhibit putting attached substances between the wafers at the bonding interface during bonding, and generating surface defects on a bonded wafer. In addition, increasing the bonding strength by the plasma activation enables further improvement in quality of the bonded wafer, and even when the wafer back surface is in point contact or line contact with the stage, there is no problem of generation and stability of plasma and a sufficient effect of plasma radiation can be achieved.

DESCRIPTION OF EMBODIMENTS

Embodiments of the present invention will be described below, but the present invention is not limited to these embodiments.

As described above, a stage used for placing a wafer in a plasma activation treatment performed before bonding is conventionally configured such that the contact area with the back surface of the wafer is larger. The investigation conducted by the present inventor, however, revealed that such a configuration is a factor that increases particles attached to the back surface of the wafer.

The present inventor has diligently studied to solve this problem and consequently found that when a plasma activation treatment is performed while the back surface of a wafer to be subjected to plasma activation is placed on a stage of a plasma activation apparatus with the back surface being in point contact or line contact with the stage, increase in attached substances on the placing surface side (the back surface side) of the wafer can be inhibited, thereby bringing the present invention to completion.

The inventive method for manufacturing a bonded wafer will now be described with reference to figures, but the present invention is not limited thereto.

Figure 1:
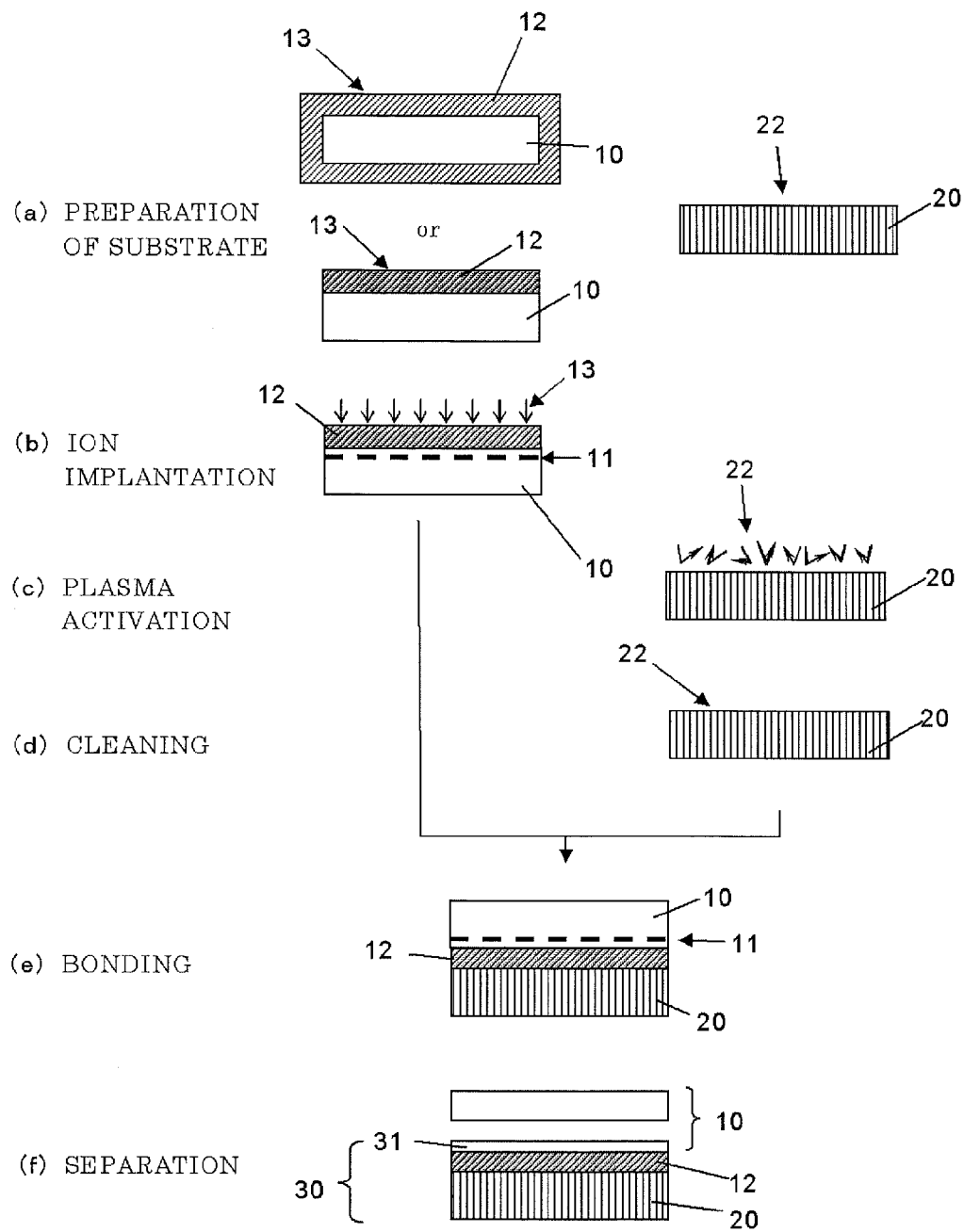
FIG. 1 is a flow chart of an example of the inventive method for manufacturing a bonded wafer.

FIG. 1 is a flow chart of an example of the inventive method for manufacturing a bonded wafer.

First, two double-sided mirror-polished silicon single crystal wafers, for example, are prepared as a bond wafer 10 and a base wafer 20, which is a supporting substrate (FIG. 1 at (a)).

As described later, the bond wafer 10 and the base wafer 20 are bonded directly or through an oxide film in a subsequent process. If these wafers are bonded through an oxide film, then an oxide film 12 is previously formed on at least one of the bond wafer 10 and the base wafer 20. The oxide film 12 may be formed by, for example, thermal oxidation, chemical vapor deposition (CVD) oxidation, and the like, and becomes a buried oxide film of a bonded wafer, such as an SOI wafer.

The oxide film 12 is formed on the bond wafer 10 alone in FIG. 1, but may be formed on the base wafer 20 alone or on both wafers. As illustrated in FIG. 1, the oxide film 12 may be formed on the front surface side of the wafer, or on all the surfaces of the wafer. If the bond wafer 10 and the base wafer 20 are directly bonded, then the oxide film 12 does not need to be formed.

Next, at least one type of gas ions selected from a group including hydrogen ions and rare gas ions are implanted into the bond wafer 10 through the oxide film 12 from the bonded surface 13 of the bond wafer 10 to form a layer 11 of the implanted ions in the interior of the wafer (FIG. 1 at (b)). At this time, ion implantation conditions such as an implantation energy (an ion implantation accelerating voltage), an implantation dose, and an implantation temperature may be properly adjusted such that a thin film having a prescribed thickness can be obtained.

Next, for the purpose of increasing the bonding strength of a bonded wafer, a plasma activation treatment is performed on both or one of the bonded surface 13 of the ions-implanted bond wafer 10 and the bonded surface 22 of the base wafer 20 with a plasma activation apparatus (FIG. 1 at (c)).

Figure 2:
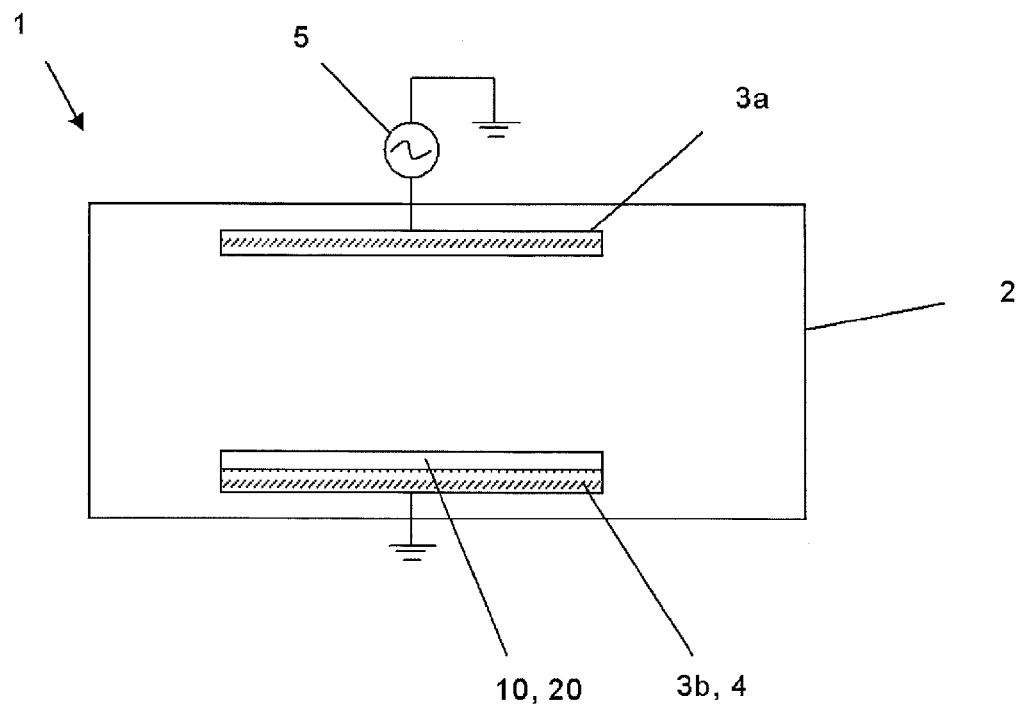
FIG. 2 is a schematic diagram of an exemplary plasma activation apparatus used for a plasma activation treatment in the inventive method for manufacturing a bonded wafer.

FIG. 2 illustrates an exemplary plasma activation apparatus for use in the plasma activation treatment in the inventive method for manufacturing a bonded wafer. As illustrated in FIG. 2, the plasma activation apparatus 1 includes an upper electrode 3a and a lower electrode 3b, for generating plasma, that have a parallel-plate shape, a radio frequency generator 5, a stage 4 for placing a wafer to be treated. These members are arranged in a chamber 2. In the exemplary apparatus illustrated in FIG. 2, a wafer is placed on the lower electrode 3b that serves the function of the stage 4.

With the plasma activation apparatus 1, the bonded surface of a wafer to be treated, i.e., at least one of the bond wafer 10 and the base wafer 20, is exposed to plasma and thereby plasma-activated. Here, the plasma may be oxygen plasma or nitrogen plasma, for example.

In the plasma activation treatment, the back surface of the wafer to be treated is placed on the stage 4 such that the back surface comes in point contact or line contact with the stage 4. The plasma activation treatment is performed in this status. More specifically, the wafer to be treated is placed on a point-like or line-like protrusion formed on a surface of the stage 4 or on a base that has a point-like or line-like support and is disposed on a surface of the stage 4, so that the back surface is brought in point contact or line contact with the stage 4.

In this manner, the contact area between the wafer back surface and the stage is reduced and increase in attached substances, such as particles, on the back surface side can be greatly inhibited.

A metal member (a metal plate) coated with Si may be used as the material of the stage 4 to fulfill requirements that the stage acts as an electrode for generating plasma, metal contamination due to direct contact with the back surface of a wafer is prevented, and deterioration due to plasma is prevented.

The material of which the above support and base of the stage 4 is made may be identical to or different from that of the stage 4. When this material differs from that of the stage 4, quartz ($SiO_2$) is preferably used from the viewpoint of prevention of metal contamination, deterioration due to plasma, and so on. If an insulating material, such as quartz, is used for the support and the base of the stage 4, then a metal plate that forms the stage 4 is preferably coated with Si to prevent metal contamination on its surface.

Figure 3:
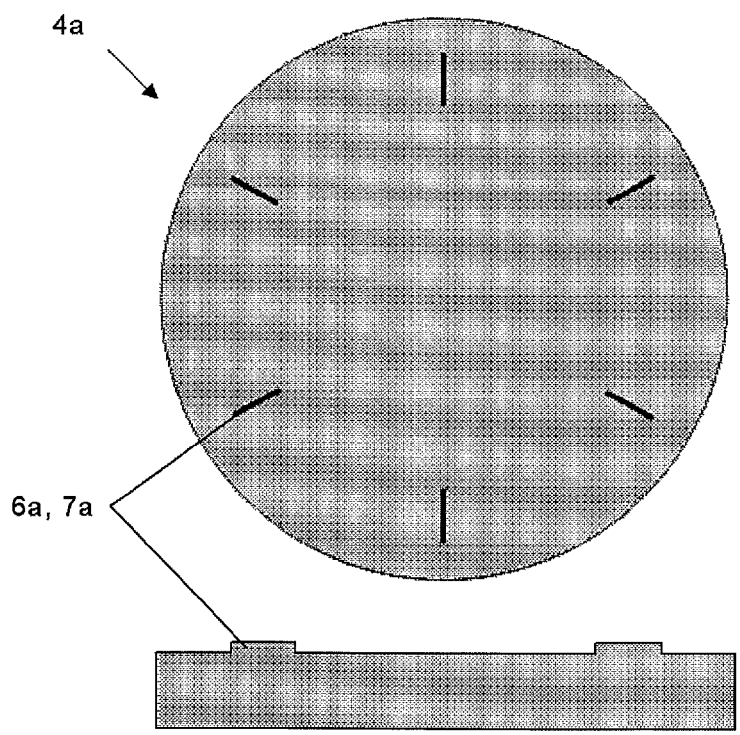
FIG. 3 is a schematic diagram of an example of a stage of the plasma activation apparatus illustrated in FIG. 2.
Figure 4:
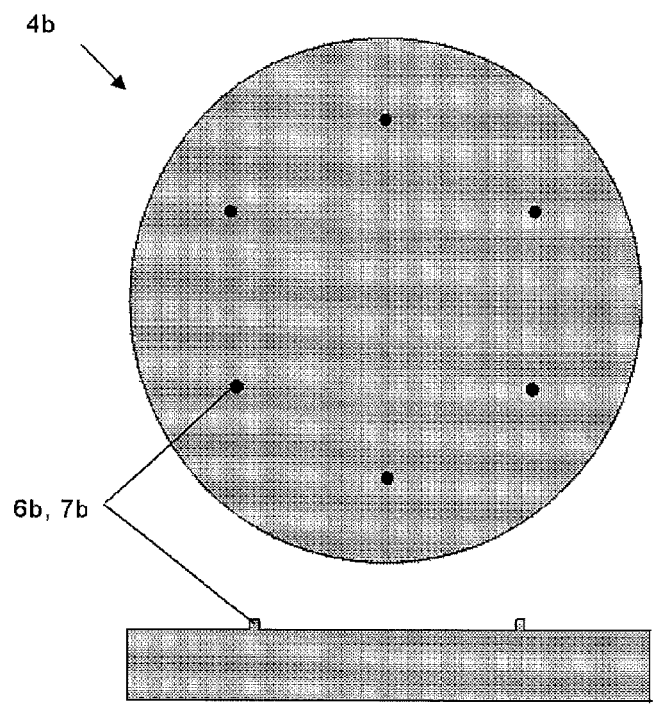
FIG. 4 is a schematic diagram of another example of a stage of the plasma activation apparatus shown in FIG. 2.

FIGS. 3 and 4 show specific examples of the stage 4 that can be used in the present invention.

FIG. 3 shows an exemplary stage configured to come in line contact with a wafer back surface. In the stage 4a in this example, six line-like protrusions 6a are formed at an angular interval of 60° on a surface of a metal plate electrode having substantially the same diameter as a wafer to be placed. These protrusions 6a are formed integrally with the metal plate electrode. Alternatively, cylindrical or prismatic supports 7a may be produced with the same material as the metal plate electrode or an insulating material such as quartz to attach a side surface of the produced supports to the surface of the metal plate electrode. A base including such supports 7a may alternatively be disposed on the metal plate electrode.

The cylindrical or prismatic supports 7a may be configured to be engaged with grooves formed on a surface of the metal plate electrode such that upper parts of the supports protrude from the surface of the stage.

When the side surface of the cylindrical or prismatic protrusion or support is brought in contact with a wafer back surface, the contact with the wafer back surface is line contact. In addition, even contact with prismatic one having not less sides than a quadrangular prism, if the width of a contact portion with a wafer is 3 mm or less, is included in the concept of line contact in the present invention, because the contact area can be sufficiently small.

The length of the line-like protrusion or support is preferably more than the width and equal to or less than half of the diameter of the wafer, more preferably equal to or less than quarter of the diameter.

FIG. 4 shows an exemplary stage configured to come in point contact with a wafer back surface. In the stage 4b in this example, six point-like protrusions 6b are formed at an angular interval of 60° on a surface of a metal plate electrode having substantially the same diameter as a wafer to be placed. These protrusions 6b are formed integrally with the metal plate electrode. Alternatively, point-like supports 7b may be produced with the same material as the metal plate electrode or an insulating material such as quartz to attach a surface of the produced supports to the surface of the metal plate electrode. A base including such supports 7b may alternatively be disposed on the metal plate electrode.

The supports 7b may be configured to be engaged with recess formed on a surface of the metal plate electrode such that upper parts of the supports protrude from the surface of the stage.

When the vertex of a spherical, conic, or regular pyramid-like protrusion or support is brought in contact with a wafer back surface, the contact with the wafer back surface is point contact. In addition, even contact with cylindrical or regular prismatic one, if its diameter (in the case of the prismatic one, the diameter of its inscribed circle) is 3 mm or less, is included in the concept of point contact in the present invention, because the contact area can be sufficiently small. If the support is conic, regular pyramid, cylindrical, or regular prismatic, then its bottom may be attached to the surface of the metal plate electrode or engaged with the recess.

Examples of the arrangement of the protrusion and support may include three places, as the minimum number, at an angular interval of 120°, four places at 90°, eight places at 45°, and 12 places at 30°, other than six places at 60° as shown in FIGS. 3 and 4.

When the wafer to be subjected to the plasma activation treatment is placed on a stage having such a protrusion, a support, or a base provided with the support, since the back surface of the wafer is supported by the protrusion or the support, a proper space (about 1 mm, for example) is defined between the stage surface and the wafer back surface.

Figure 5:
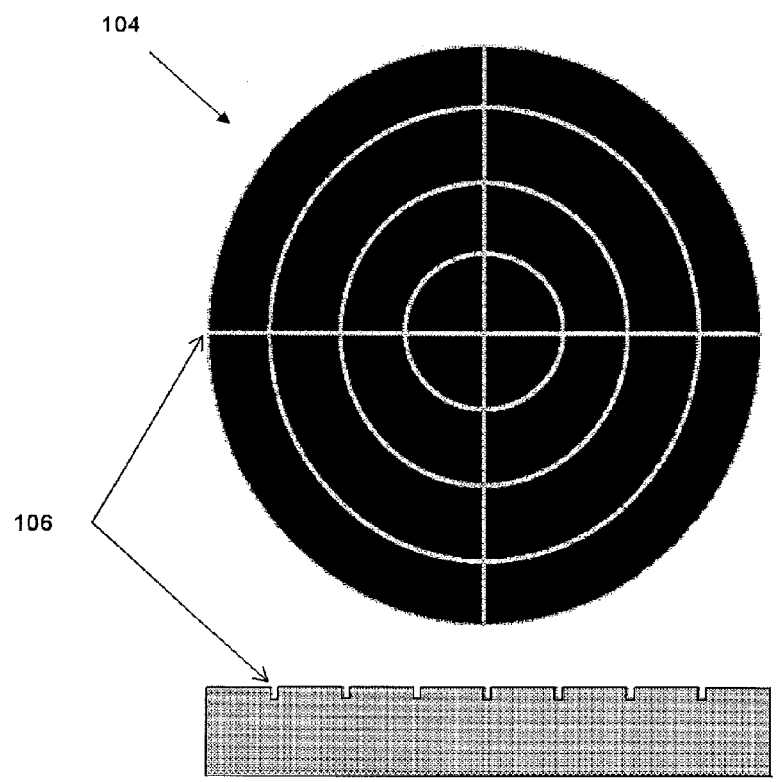
FIG. 5 is a schematic diagram of a stage of a plasma activation apparatus used for a plasma activation treatment in a conventional method for manufacturing a bonded wafer.

Accordingly, there is no need to provide such a groove for air bleeding as is formed on the surface of the stage of the conventional plasma activation apparatus illustrated in FIG. 5. Since there is a space between the wafer and the lower electrode, on the other hand, it is feared that the generation of plasma or an effect on activation of the wafer surface may be reduced. According to the experiments, conducted by the inventor, on a plasma activation treatment under normal plasma generation conditions, however, it was confirmed that the bonding strength can sufficiently be increased, even when the support is made of quarts, which is an insulator.

Next, pre-bond cleaning of the wafer subjected to the plasma activation is performed with a batch cleaning apparatus (FIG. 1 at (d)). The batch cleaning apparatus enables a plurality of wafers to be simultaneously cleaned, thereby shortening the processing time. As described above, the present invention can greatly inhibit increase in particles on the wafer back surface during the plasma activation treatment, thereby avoiding the problem that particles are re-attached from the back surface to the front surface of the wafer that has been cleaned by the plasma activation in a batch cleaning process, which is the problem in the past.

Next, the surface from which the ions are implanted into the bond wafer 10 is brought in close contact with and bonded to a surface of the base wafer (FIG. 1 at (e)). The resultant wafer after bonding is subjected to heat treatment including a heat treatment in which the wafer is held, for example, at a temperature ranging from 350° C. to 500° C. under an inert gas atmosphere to form a micro bubble layer along the layer of the implanted ions. Finally, the bond wafer 10 is separated along the micro bubble layer (the layer of the implanted ions) to obtain a bonded wafer 30 having a thin film 31 on the base wafer 20 (FIG. 1 at (f)).

The inventive method for manufacturing a bonded wafer can inhibit putting particles between the wafers at the bonding interface during bonding and generating surface defects on a bonded wafer. In addition, increasing the bonding strength by the plasma activation enables further improvement in quality of the bonded wafer.

EXAMPLE

The present invention will now be more specifically described with reference to Examples and Comparative Example, but the present invention is not limited to these examples.

Example 1

A silicon single crystal wafer having a diameter of 300 mm, a thickness of 775 μm, and no COP was prepared as a bond wafer. An oxide film having a thickness of 145 nm was grown, and $5 \times 10^{16}$ atoms/cm$^2$ of H$^+$ ions were implanted at an implantation energy of 50 keV with an ion implanting apparatus to form a layer of the implanted ions.

The same silicon single crystal wafer as the bond wafer except that no oxide film was formed on its surface was prepared as a base wafer. A plasma activation treatment with nitrogen plasma was performed. In this treatment, a stage in which quartz supports configured to come in line contact with a wafer back surface was formed on its surface, as illustrated in FIG. 3, was used as a stage of a plasma activation apparatus. More specifically, a metal lower electrode having substantially the same diameter of the base wafer was coated with Si, and as illustrated in FIG. 3, cylindrical supports (having a diameter of 2 mm and a length of 20 mm) were disposed on the coated surface in six places at an angular interval of 60° such that its side surface contacted the surface of the lower electrode. Grooves (having a width of 2 mm, a length of 20 mm, and a depth of 1 mm), for engagement with cylindrical supports, were formed at positions at which the cylindrical supports were to be disposed on the surface of the lower electrode.

The number of particles having a size of 0.1 μm or more on the front and back surfaces of the base wafer after the plasma activation treatment was then measured with a laser scattering type of surface inspection apparatus (SP1 made by KLA Tencor Corporation). The number of particles on the front surface of the base wafer was 11 pcs per wafer. The number of particles on the back surface of the base wafer was 800 pcs per wafer, and greatly reduced as compared with 8566 pcs per wafer in the later-described Comparative Example.

After the plasma activation treatment of the base wafer, 25 bond wafers as one batch and 25 base wafers as one batch were cleaned with a batch cleaning apparatus before bonding. After cleaning, the number of particles on the front surface of the base wafer was measured in the same manner as above. The number was reduced to 2 pcs per wafer.

Next, the bond wafer surface from which ions were implanted was brought into close contact with and bonded to the base wafer surface subjected to the plasma activation. A heat treatment at temperatures ranging from an input temperature of 200° C. to a maximum temperature of 500° C. was then performed in a batch type of lateral furnace to separate the bond wafer along the layer of the implanted ions such that an SOI layer was formed on the base wafer, thereby obtaining an SOI wafer. The surface of the formed SOI layer was smoothed and the thickness of the SOI layer was adjusted. A visual void inspection in which a void with a diameter of 300 μm was regarded as a limit sample was performed as a defect inspection. The result was that no void with a large diameter of 300 μm or more was detected in the SOI wafer.

Accordingly, it was confirmed that the inventive method for manufacturing a bonded wafer can inhibit increase in attached substances such as particles on the back surface of a wafer during a plasma activation treatment, and prevent re-attachment of the attached substances to the bonded surface of the wafer when the wafer is cleaned with a batch cleaning apparatus after the plasma activation treatment.

Comparative Example

An SOI wafer was manufactured under the same conditions as in Example 1 except that in a plasma activation treatment, a stage that was brought in surface contact with the back surface of a wafer such that the back surface did not contact grooves, for air bleeding at the time of wafer transportation, formed on its flat surface, as illustrated in FIG. 5, was used as a stage of a plasma activation apparatus.

The number of particles having a size of 0.1 μm or more on the front and back surfaces of the base wafer after the plasma activation treatment was then measured in the same manner as in Example 1. The number of particles on the front surface of the base wafer was 10 pcs per wafer and the number of particles on the back surface of the base wafer was 8566 pcs per wafer. The particle contamination on the back surface was significantly increased as compared with Example 1.

In addition, the number of particles on the front surface of the base wafer was measured after cleaning with a batch cleaning apparatus. The number was increased to 25 pcs per wafer. In Comparative Example, the number of particles on the front surface of the cleaned base wafer was thus rather increased.

In addition, the defect inspection of the manufactured SOI wafer was performed. The result was that three voids having a large diameter of 300 μm or more were detected in the SOI wafer. Since a device cannot be formed at a location where such a void exists on the SOI layer, the SOI wafer may be judged as a standard failure in many cases.

Example 2

An SOI wafer was manufactured under the same conditions as in Example 1 except that in the plasma activation treatment, a stage in which quartz supports configured to come in point contact with the back surface of a wafer was formed on its surface, as illustrated in FIG. 4, was used as a stage of a plasma activation apparatus. In the used stage, a metal lower electrode having substantially the same diameter of the base wafer was coated with Si, and as illustrated in FIG. 4, cylindrical supports (having a diameter of 3 mm and a height of 2 mm) were disposed on the coated surface in six places at an angular interval of 60°. Recesses (having a diameter of 3 mm and a depth of 1 mm), for engagement with cylindrical supports, were formed at positions at which the cylindrical supports were to be disposed on the surface of the lower electrode.

The number of particles having a size of 0.1 μm or more on the front and back surfaces of the base wafer after the plasma activation treatment was measured in the same manner as in Example 1. The number of particles on the front surface of the base wafer was 10 pcs per wafer and the number of particles on the back surface of the base wafer was 500 pcs per wafer.

In addition, the number of particles on the front surface of the base wafer was measured after cleaning with the batch cleaning apparatus. The number was reduced to 3 pcs per wafer.

In addition, the defect inspection of the manufactured SOI wafer was performed. The result was that no void with a large diameter of 300 μm or more was detected in the SOI wafer.

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

For example, although the embodiments described above include the case of point contact alone (FIG. 4) and the case of line contact alone (FIG. 3) as examples of point contact and line contact, it is possible to combine point contact and line contact.

The invention claimed is:

1. A method for manufacturing a bonded wafer, comprising:
    implanting at least one gas ion selected from a hydrogen ion and a rare gas ion into a bond wafer from a surface of the bond wafer to form a layer of the implanted ion;
    bonding the surface from which the ion is implanted into the bond wafer and a surface of a base wafer directly or through an oxide film; and
    separating the bond wafer along the layer of the implanted ion to form a bonded wafer having a thin film on the base wafer;
    the method further comprising performing a plasma activation treatment on at least one of the bonded surfaces of the bond wafer and the base wafer before bonding, wherein
    the plasma activation treatment is performed while a back surface of at least one of the bond wafer and the base wafer is placed on a stage with the back surface being in point contact or line contact with the stage, and the bond wafer or the base wafer subjected to the plasma activation treatment is cleaned with a batch cleaning apparatus before bonding.

2. The method for manufacturing a bonded wafer according to claim 1, wherein in the plasma activation treatment, at least one of the bond wafer and the base wafer is placed on a point-like or line-like protrusion formed on a surface of the stage, whereby the back surface is in point contact or line contact with the stage.

3. The method for manufacturing a bonded wafer according to claim 1, wherein in the plasma activation treatment, at least one of the bond wafer and the base wafer is placed on a base having a point-like or line-like support, the base being disposed on a surface of the stage, whereby the back surface is in point contact or line contact with the stage.

* * * * *